United States Patent
Chen et al.

(10) Patent No.: US 10,032,712 B2
(45) Date of Patent: Jul. 24, 2018

(54) SEMICONDUCTOR STRUCTURE

(71) Applicant: Taiwan Semiconductor Manufacturing Company Limited, Hsin-Chu (TW)

(72) Inventors: Ying-Ju Chen, Tuku Township (TW); Hsien-Wei Chen, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/855,812

(22) Filed: Apr. 3, 2013

(65) Prior Publication Data
US 2014/0264922 A1 Sep. 18, 2014

Related U.S. Application Data

(60) Provisional application No. 61/800,401, filed on Mar. 15, 2013.

(51) Int. Cl.
*H01L 21/44* (2006.01)
*H01L 29/40* (2006.01)
(Continued)

(52) U.S. Cl.
CPC .... *H01L 23/5226* (2013.01); *H01L 21/76805* (2013.01); *H01L 21/76807* (2013.01);
(Continued)

(58) Field of Classification Search
CPC ............. H01L 23/481; H01L 21/76898; H01L 23/5226; H01L 23/53238;
(Continued)

(56) References Cited

U.S. PATENT DOCUMENTS 6,955,981 B2  10/2005 Lee et al.
7,259,463 B2  8/2007 Huang et al.
(Continued)

FOREIGN PATENT DOCUMENTS

DE 102008021568 B3 2/2010
DE 112010003659 T5 10/2012
(Continued)

OTHER PUBLICATIONS

Korean Patent Office, Korean Patent No. 10-2013-0088678; Office action dated May 31, 2016, 14 pages.
(Continued)

*Primary Examiner* — Su C Kim
(74) *Attorney, Agent, or Firm* — Haynes and Boone, LLP

(57) ABSTRACT

One or more embodiments of techniques or systems for forming a semiconductor structure are provided herein. A first metal region is formed within a first dielectric region. A cap region is formed on the first metal region. A second dielectric region is formed above the cap region and the first dielectric region. A trench opening is formed within the second dielectric region. A via opening is formed through the second dielectric region, the cap region, and within some of the first metal region by over etching. A barrier region is formed within the trench opening and the via opening. A via plug is formed within the via opening and a second metal region is formed within the trench opening. The via plug electrically connects the first metal region to the second metal region and has a tapered profile.

20 Claims, 15 Drawing Sheets

(51) Int. Cl.
*H01L 23/522* (2006.01)
*H01L 23/532* (2006.01)
*H01L 21/768* (2006.01)

(52) U.S. Cl.
CPC .... *H01L 23/5329* (2013.01); *H01L 23/53238* (2013.01); *H01L 23/53295* (2013.01); *H01L 21/76834* (2013.01); *H01L 21/76849* (2013.01); *H01L 2924/0002* (2013.01)

(58) Field of Classification Search
CPC . H01L 2224/16225; H01L 2924/01029; H01L 21/76843; H01L 23/485; H01L 21/76816; H01L 21/76897; H01L 28/91; H01L 2225/06541; H01L 21/76831; H01L 21/02063; H01L 21/76807; H01L 21/76805; H01L 23/5329; H01L 23/53295; H01L 2924/0002; H01L 21/76834; H01L 21/76849
USPC ..... 257/774, 330, 751, 334, 43, 773, 2, 316, 257/4, 48, 737, 758, 506, 522, 621, 734, 257/88, 99, E21.577, E23.011, 145, 288, 257/292, 296, 306, 314, 324, 329, 368, 257/392, 421, 431, 432, 447, 499, 5, 532, 257/668, 698, 755, 760, 777, 93; 438/382, 270, 643, 652, 667, 69, 268, 438/381, 586, 613, 637, 653, 666, 675, 438/151, 18, 212, 243, 253, 257, 285, 438/296, 3, 303, 396, 399, 424, 427, 46, 438/589, 592, 601, 625, 626, 655, 672, 438/68, 692, 7, 8, 99
See application file for complete search history.

(56) References Cited

U.S. PATENT DOCUMENTS

| | | | |
|---|---|---|---|
| 2004/0251552 A1 | 12/2004 | Takewaki et al. | |
| 2006/0118962 A1* | 6/2006 | Huang et al. ................. | 257/760 |
| 2006/0205204 A1* | 9/2006 | Beck ................... | H01L 21/7684 |
| | | | 438/628 |
| 2007/0126121 A1* | 6/2007 | Shue et al. .................... | 257/774 |
| 2007/0202689 A1 | 8/2007 | Choi et al. | |
| 2008/0057698 A1* | 3/2008 | Ishigami ....................... | 438/618 |
| 2008/0067680 A1* | 3/2008 | Sakai et al. .................. | 257/751 |
| 2008/0136029 A1* | 6/2008 | Liu ................... | H01L 21/76834 |
| | | | 257/751 |
| 2008/0150138 A1* | 6/2008 | Bright ............... | H01L 21/76805 |
| | | | 257/751 |
| 2009/0194876 A1* | 8/2009 | Yang ................ | H01L 21/76805 |
| | | | 257/751 |
| 2009/0206485 A1* | 8/2009 | Yang et al. ................. | 257/751 |
| 2013/0221527 A1* | 8/2013 | Yang ................ | H01L 23/53223 |
| | | | 257/751 |

FOREIGN PATENT DOCUMENTS

| | | |
|---|---|---|
| JP | 2003-243393 | 8/2003 |
| KR | 2004-0098573 | 11/2004 |

OTHER PUBLICATIONS

Korean Patent Office, Korean Patent No. 10-2013-0088678; Office action dated Aug. 19, 2015, 11 pages.

* cited by examiner

US 10,032,712 B2

SEMICONDUCTOR STRUCTURE

BACKGROUND

Via plugs are often used to connect metal regions of an integrated circuit (IC). For example, a via plug can be used to connect a first meal layer of an IC to a second metal layer of the IC.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
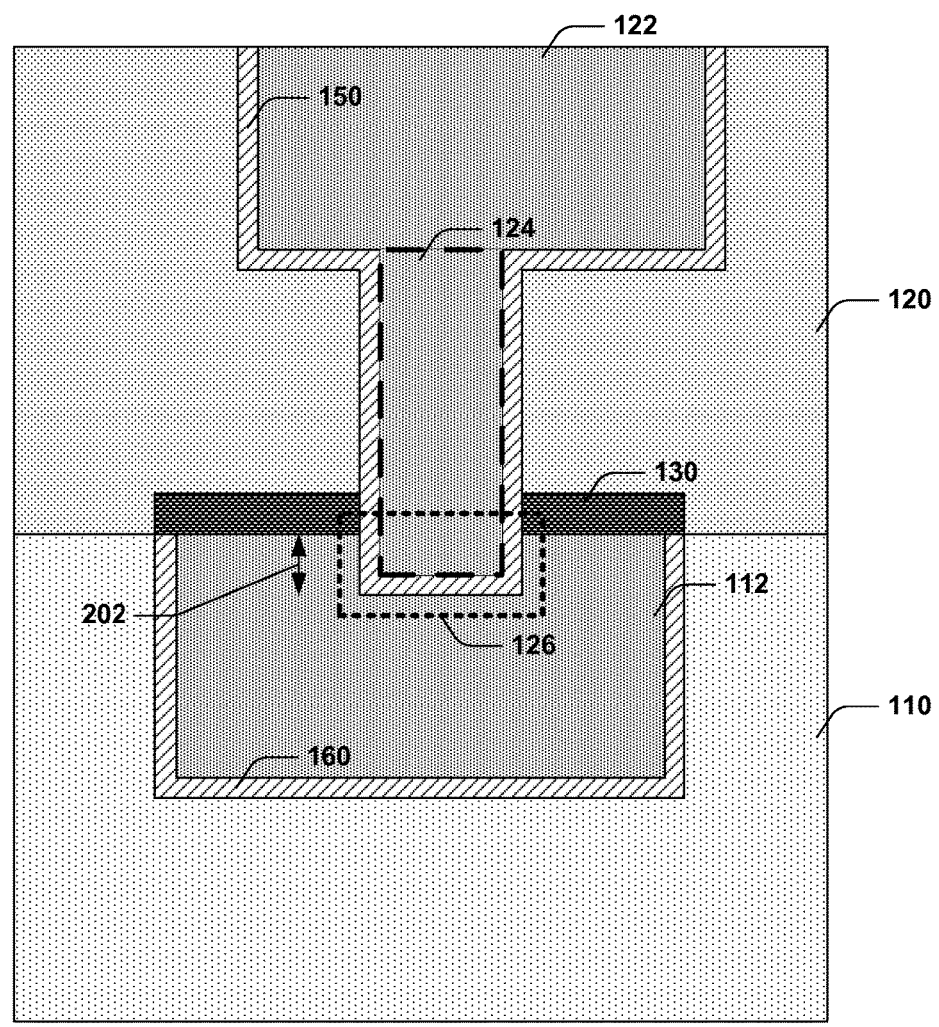
FIG. 1 is a cross-sectional view of a semiconductor structure, according to some embodiments

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

It will be appreciated that for some of the figures herein, one or more boundaries, such as boundary 126 of FIG. 1, for example, are drawn with different heights, widths, perimeters, aspect ratios, etc. relative to one another merely for illustrative purposes, and are not necessarily drawn to scale. For example, because dashed or dotted lines are used to represent different boundaries, if the dashed and dotted lines were drawn on top of one another they would not be distinguishable in the figures, and thus are drawn with different dimensions or slightly apart from one another, in some of the figures, so that they are distinguishable from one another. As another example, where a boundary is associated with an irregular shape, the boundary, such as a box drawn with a dashed line, dotted lined, etc., does not necessarily encompass an entire component in some instances. Conversely, a drawn box does not necessarily encompass merely an associated component, in some instances, but encompasses at least a portion of one or more other components as well.

The following figures illustrate formation of a semiconductor structure during semiconductor fabrication, according to some embodiments. It will be appreciated that the respective figures are described with reference to one another, such as with reference to a previous figure. For example, FIG. 5-FIG. 15 illustrates intermediate stages of formation of a semiconductor structure according to some embodiments.

Generally, a metal region, such as a copper line of an integrated circuit (IC), is formed within a dielectric. Stress migration (SM) and electromigration (EM) are two known phenomena that often occur in ICs. Both SM and EM generally lead to voids within conductors that degrade the performance of an IC. For example, in EM, current flow within a conductor causes a transfer of momentum from electrons to ions which displaces atoms and leads to voids in the conductor. In SM, voids form as result of vacancy migration and a hydrostatic stress gradient. Voids in a conductor lead to open circuits or an increased resistance that impedes the performance of the IC. Often, a cap region is formed on a metal region to mitigate such EM and SM. The cap region is formed of materials that inhibit the effects of EM and SM, thereby resulting in formation of fewer voids, for example.

According to some embodiments provided herein, a via plug is formed to connect a first metal region to a second metal region where a cap region is formed over the first metal region. Accordingly, a portion of the via plug extends through the cap region and into the first metal region. It will be appreciated that having the via plug extend through the cap region allows the EM and SM benefits afforded by the cap region to be substantially retained, while allowing RC issues that would otherwise occur if the via plug landed on, or merely extended into, the cap region to be reduced. For example, the cap region is generally formed of a different material than the first metal region, the via plug and the second metal region. Accordingly, the presence of the cap region between the first metal region and the second metal region increases the resistivity of a conductive path between the first metal region and the second metal region. Allowing the conductive path to merely comprise the first metal region, the via plug and the second conductive region reduces the resistance of the conductive path, which in turn reduces RC delay associated with the IC.

Additionally, according to some embodiments, the bottom portion of the via plug that extends into the first metal region is formed to have a tapered profile. It will be appreciated that the tapered profile is formed to have varying degrees or amounts of taper by controlling one or more variables of etching processes, for example. Accordingly, the tapered profile is substantially rounded in some embodiments. The tapered profile offers advantages over non-tapered profiles, such as allowing a barrier layer or other layers to be more uniformly or conformally formed within an opening within which the tapered via plug is formed. The tapered profile also allows the via plug to be formed into the first metal region, where fewer voids and more sustained contact between the via plug and the first metal region are likely to occur as compared to a rectangular or square shaped via plug having sharp corners. Also, the lack of sharp corners mitigates electro-magnetic fields or flux lines that are prone to develop at sharp corners, where such fields can inhibit current flow or at least interfere with the uniformity or predictability of current flow. It will be appreciated, however, that a non-tapered or rectangular profile is nevertheless contemplated herein. That is, the scope of the instant application is not limited to a tapered or non-rectangular profile.

FIG. 1 is a cross-sectional view 100 of a semiconductor structure, according to some embodiments. A first dielectric region 110 is formed on a base material, such as a semiconductor substrate (not shown). In some embodiments, the first dielectric region 110 comprises a thickness greater than about 500 Å. In some embodiments, the first dielectric region 110 has a low dielectric constant (k value), such as a value of about 3.8 or below. In some embodiments, the first dielectric region 110 has a k value of about 3.0 or below. In some embodiments, the first dielectric region 110 has a k value of about 2.5 or below. The first dielectric region 110 is, in some embodiments, further characterized or classified as ultra low-K (ULK), extra low-K (ELK), or extreme low-k (XLK), where the classification is generally based upon the k value. For example, ULK generally refers to materials with a k value of between about 2.7 to about 2.4, ELK generally refers to materials with a k value of between about 2.3 to about 2.0, and XLK generally refers to materials with a k value of less than about 2.0. In some embodiments, the first dielectric region 110 comprises carbon, hydrogen, oxygen, or combinations thereof. By way of further example, and not limitation, the first dielectric region 110 comprises spin-on glass (SOG), fluorinated silica glass (FSG), organosilicate glass, porogen-containing material(s), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, other proper porous polymeric material(s), other suitable dielectric material(s), or combinations thereof. In some embodiments, the first dielectric region 110 comprises one or more dopants. As with other structures, features, elements, layers, etc. provided herein, the first dielectric region 110 is formed by any suitable process, such as spin-on coating, chemical vapor deposition (CVD), atomic layer deposition (ALD), high density plasma CVD (HP-CVD), low pressure CVD (LPCVD), metal organic CVD (MOCVD), remote plasma CVD (RPCVD), plasma enhanced CVD (PECVD), high density plasma (HDP) process, high aspect ratio process (HARP), or other suitable processes, or combinations thereof. It is understood that, in some embodiments, the first dielectric region 110 comprises one or more dielectric materials and additionally or alternatively one or more dielectric layers.

A first metal region 112 is formed within the first dielectric region 110. In this example, a top surface of the first metal region 112 is flush with a top surface of the first dielectric region 110. It will be appreciated that in some embodiments, the top surface of the first metal region 112 is not flush with the top surface of the first dielectric region 110. The first metal region 112 comprises copper, copper alloys, or copper compounds, in some embodiments. The first metal region 112 has a width between about 250 Å to about 400 Å, in some embodiments, and is formed by metallization.

A barrier region 160 is situated between the first metal region 112 and the first dielectric region 110. The barrier region 160 generally comprises a tantalum based material, such as tantalum nitride (TaN), and has a thickness of between about 10 Å to about 100 Å, in some embodiments. The barrier region 160 is formed using deposition techniques, such as sputtering, CVD, or atomic layer deposition (ALD). The barrier region 160 mitigates metal such as copper from diffusing into neighboring regions, such as the first dielectric region 110. The barrier region also serves to adhere the first metal region to the first dielectric region 110.

A cap region 130 is formed on the first metal region 112. The cap region 130 comprises a material configured to mitigate migration of metal, such as copper, from one region to another. In some embodiments, the cap region 130 is cobalt based or a cobalt containing conductive layer. For example, the cap region 130 comprises CoWP, according to some embodiments, where the CoWP mitigates copper metal from diffusing from the first metal region 112 to a second dielectric region 120. In this way, the cap region 130 mitigates electromigration associated with the copper diffusion. In some embodiments, a bottom surface of the cap region 130 is flush with the top surface of the first dielectric region 110. The cap region 130 is generally formed using PVD and is between about 100 Å and about 300 Å thick, in some embodiments. One or more layers are formed on the cap region 130 and the first dielectric region 110 according to some embodiments. In FIG. 1, a second dielectric region 120 is formed on the cap region 130 and the first dielectric region 110. The foregoing discussion regarding properties, composition, formation, etc. of the first dielectric region 110 is applicable to the second dielectric region 120 as well.

A second metal region 122 is formed within the second dielectric region 120. The second metal region 122 comprises copper, copper alloys, or copper compounds in some embodiments. A via plug 124 electrically connects the first metal region 112 to the second metal region 122. The via plug 124 also comprises copper, copper alloys, or copper compounds, in some embodiments. Although the via plug 124 and the second metal region 122 are drawn as separate regions, they are formed concurrently in some embodiments. For example, a damascene process, such as a dual damascene process is used during metallization to form a conductive line comprising the via plug 124 and the second metal region 122, where the conductive line is a single, continuous region. The second metal region 122 has a width between about 250 Å to about 400 Å, in some embodiments, and the via plug 124 has a height greater than 500 Å, in some embodiments.

The via plug 124 comprises a bottom portion 126 that extends into or is recessed within the first metal region 112.

In some embodiments, the bottom portion 126 of the via plug 124 is associated with a via recess distance 202 below an interface of the cap region 130 and the first metal region 112. The via recess distance 202 is a distance which the bottom portion 126 of the via plug 124 extends into the first metal region 112. The via recess distance 202 is between about 100 Å to about 500 Å, in some embodiments.

Due to the configuration of the via plug 124 within the first metal region 112, a conductive path through the via plug 124 and the first metal region 112 exhibits improved electrical connectivity, and thus improved RC performance. In other words, because the via plug 124 makes electrical contact with the first metal region 112 without contacting the cap region 130 as an intermediary layer, RC performance for the conductive path is enhanced, while maintaining EM and SM benefits provided by the cap region 130.

A barrier region 150 is formed between the via plug 124 and the second dielectric region 120, the cap region 130, and the first metal region 112, and between the second metal region 122 and the second dielectric region 120. The barrier region 150 is formed of tantalum nitride (TaN), cobalt, etc. and comprises a thickness from at least about 10 Å to at least about 100 Å, in some embodiments. The barrier region 150 is formed using deposition PVD techniques, such as sputtering, CVD, or ALD. The barrier region 150 mitigates metal such as copper from diffusing into neighboring dielectric regions, such as the first dielectric region 110 or the second dielectric region 120. By forming the barrier region 150 of TaN, for example, copper from the metal regions 112 and 122, and the via plug 124 is inhibited from diffusing into the second dielectric region 120 and the first dielectric region 110.

Figure 2:
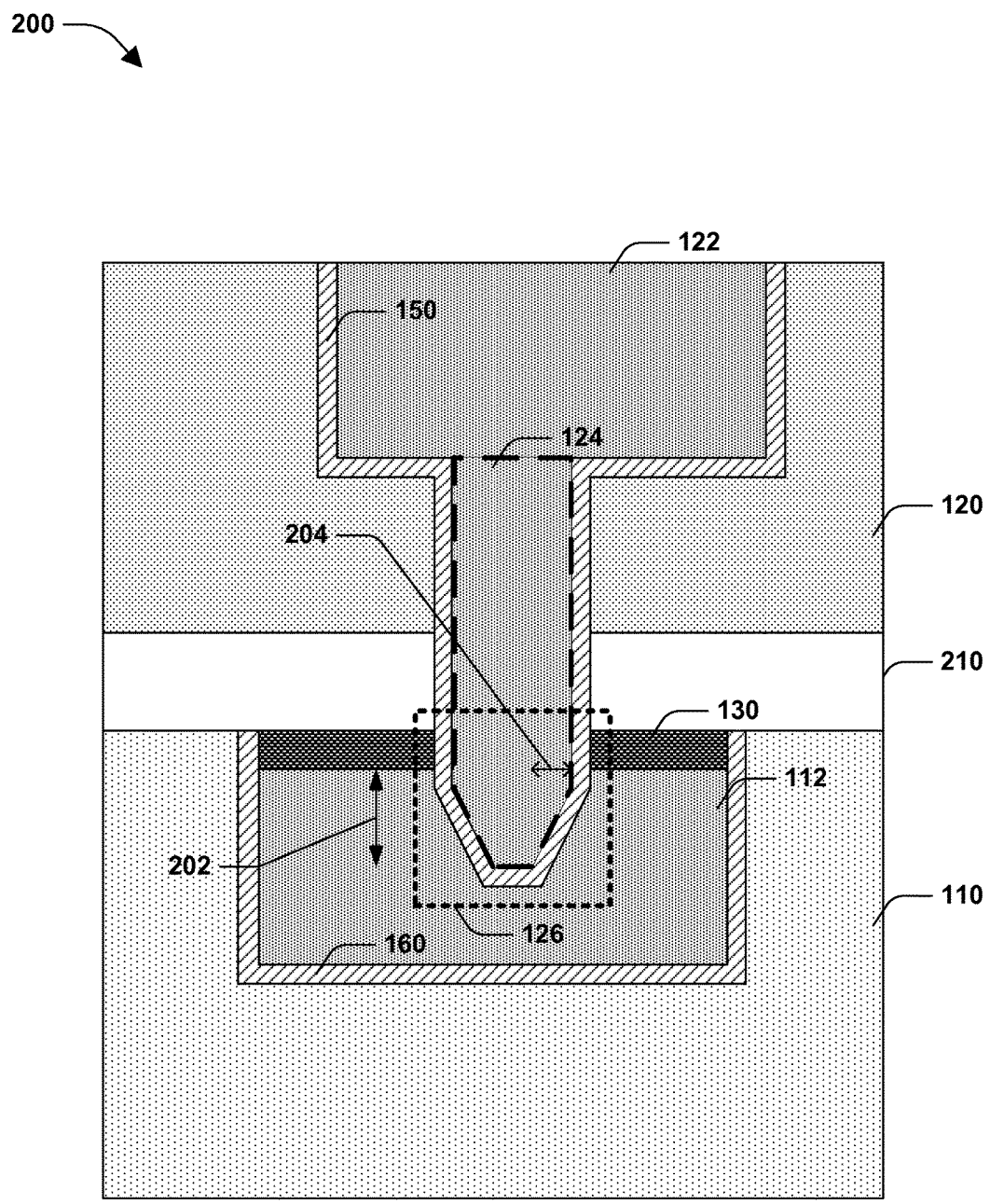
FIG. 2 is a cross-sectional view of a semiconductor structure, according to some embodiments.

FIG. 2 is a cross-sectional view 200 of a semiconductor structure, according to some embodiments. It will be appreciated that the semiconductor structure of FIG. 2 is similar to the semiconductor structure of FIG. 1, except that the semiconductor structure of FIG. 2 comprises an etch stop layer (ESL) 210 between the second dielectric region 120 and the cap region 130 and the first dielectric region 110. Additionally, the bottom portion 126 of the via plug 124 comprises a tapered profile, rather than a rectangular profile, for example. A tapered portion of the via plug has a width 204 between about 50 Å to about 150 Å, in some embodiments. It will be appreciated that in some embodiments, the cap region 130 is within the first dielectric region 110 such that a top surface of the cap region 130 is flush with a top surface of the first dielectric region 110, as illustrated in the semiconductor structure of FIG. 2. In other embodiments, the cap region 130 is within the ESL 210 or within the second dielectric region 120, as illustrated in the semiconductor structure of FIG. 1. The ESL 210 contains carbon, silicon, nitrogen, or combination thereof, in some embodiments. For example, the ESL 210 comprises SiN or SiCN. The ESL 210 is formed by a deposition technique, such as CVD, in some embodiments. The ESL 210 has a thickness of between about 100 Å to about 300 Å, in some embodiments. The semiconductor structure comprises one or more additional ESLs in some embodiments.

It will be appreciated that the tapered profile of the bottom portion 126 of the via plug 124, among other things, mitigates current clouding because the tapered profile does not comprise sharp angles, as does a rectangular profile. Generally, current clouding occurs when a higher current density is found, such as at a sharp angle of a metal region. This higher current density associated with current clouding may worsen reliability by impacting electromigration and stress migration of a structure. However, because current clouding is reduced, electromigration and stress migration are effectively reduced, thereby mitigating formation of voids, increased resistance, and open circuits within the semiconductor structure of FIG. 2, for example.

Figure 3:
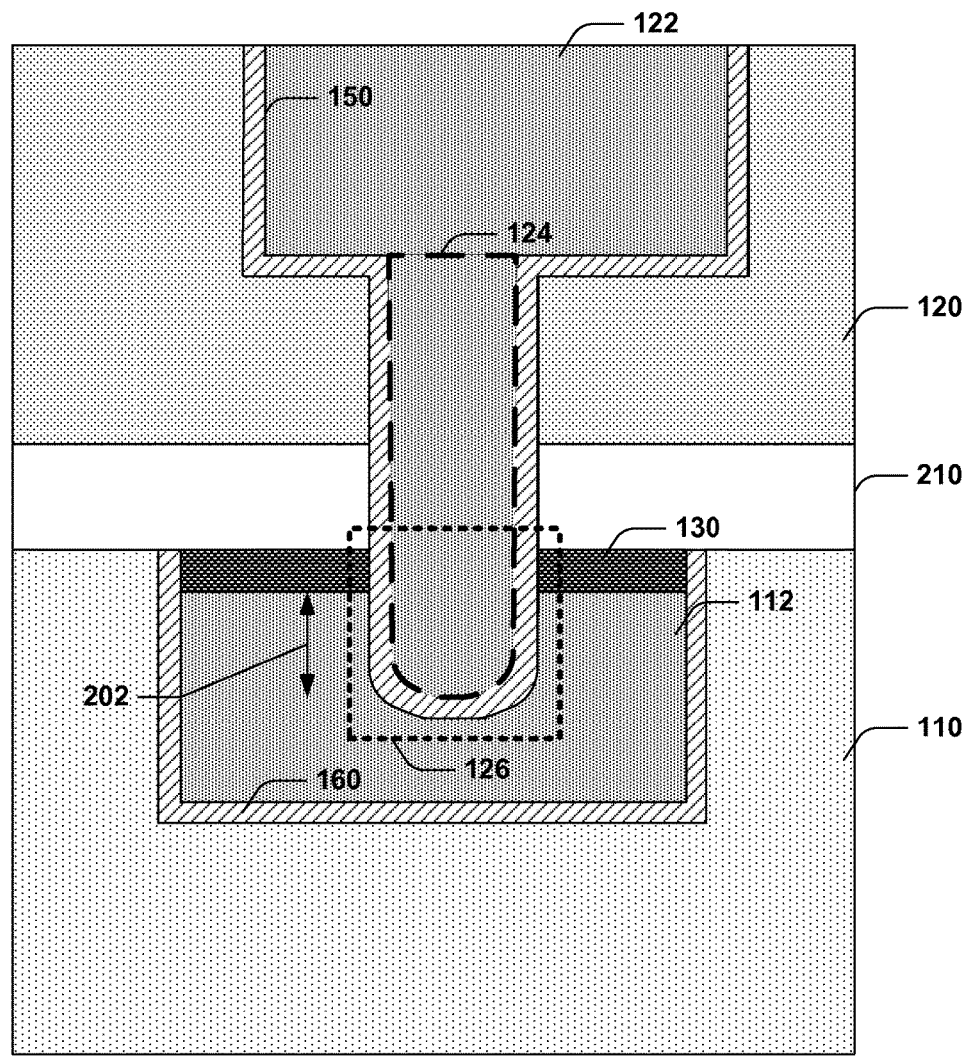
FIG. 3 is a cross-sectional view of a semiconductor structure, according to some embodiments

FIG. 3 is a cross-sectional view 300 of a semiconductor structure, according to some embodiments. It will be appreciated that the semiconductor structure of FIG. 3 is similar to the semiconductor structure of FIG. 2, except that the bottom portion 126 of the semiconductor structure is tapered to a different degree than the structure illustrated in FIG. 2. The bottom portion 126 in FIG. 3 is more rounded that that illustrated in FIG. 2, for example. It will be appreciated that by adjusting one or more of pressure, temperature, or chemistries alone or in combination with other variables, at least one of a dry etching process, wet etching process or other patterning process is controlled to achieve a desired profile. For example, at least one of a particular etch selectivity or etch rate is achieved to produce a particular degree or amount of taper, as discussed below. The tapered profile illustrated in FIG. 3 affords at least some benefits similar to those described with regard to FIG. 2.

Figure 4:
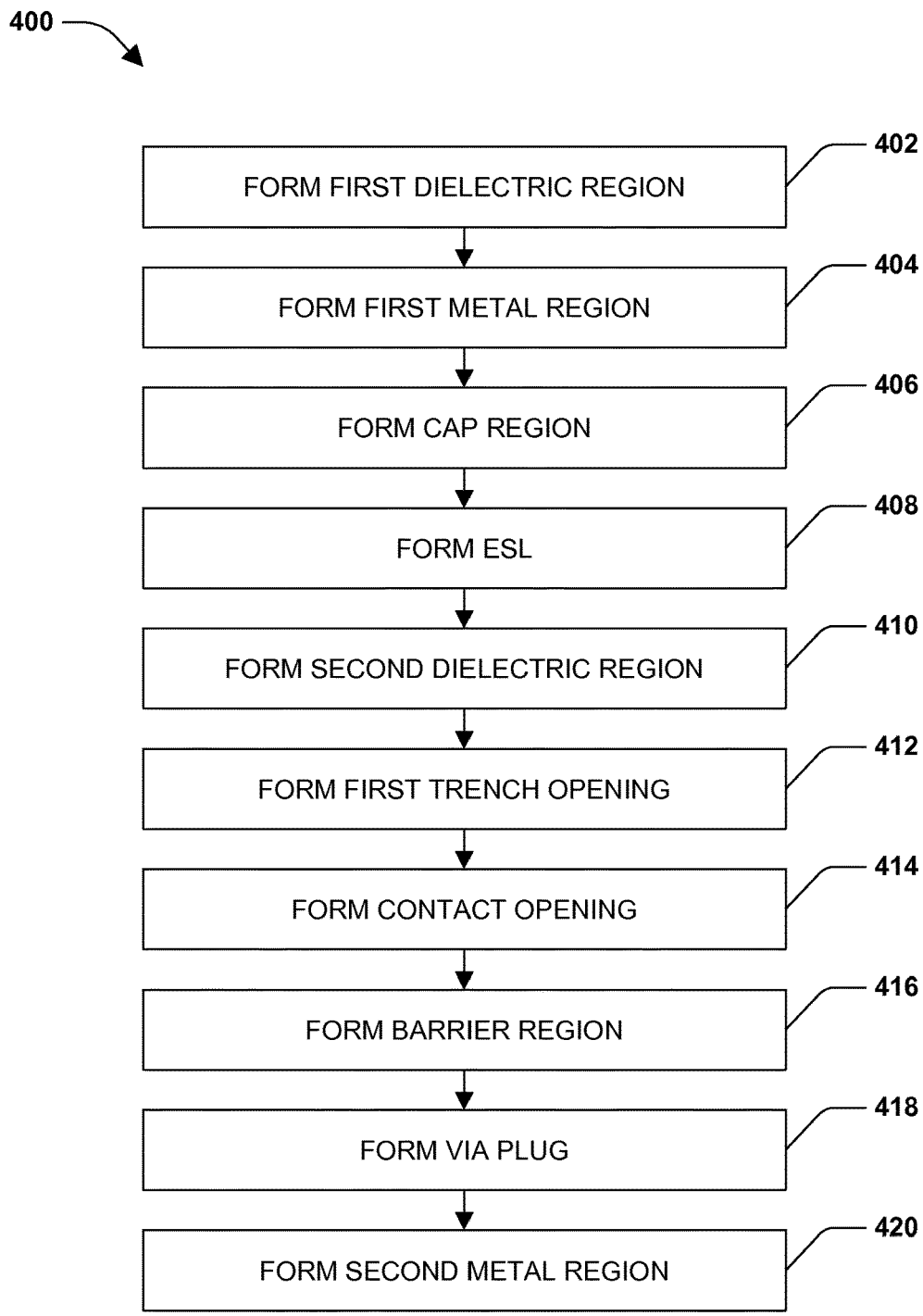
FIG. 4 is a flow diagram of a method for forming a semiconductor structure, according to some embodiments.

FIG. 4 is a flow diagram of a method 400 for forming a semiconductor structure, according to some embodiments. At 402, a first dielectric region 110 is formed on a base material, such as a substrate and comprises a thickness greater than about 500 Å, in some embodiments. At 404, a first metal region 112 is formed within the first dielectric region 110. To form the first metal region, a trench opening is formed within the first dielectric region 100 by a dry etching process, in some embodiments. For example, the first dielectric region 110 is etched using $C_4F_8$ as a reactive etchant in a plasma etching process, in some embodiments. The first metal region is formed within the trench opening of the first dielectric region by metallization, and has a width between about 250 Å to about 400 Å, in some embodiments. In some embodiments, the first meal region is formed such that a top surface of the first metal region 112 is flush with a top surface the first dielectric region 110. As an example, etch-back planarization techniques are used to planarize a surface of the first metal region such that the top surface of the first metal region 112 is flush or substantially flush with the top surface of the first dielectric region 110. In some embodiments, a barrier layer 160 is formed within the trench opening prior to forming the first metal region 112. The barrier layer serves to adhere the first metal region 112 to the first dielectric region 110 and inhibits diffusion, such as copper diffusion, from the first metal region 112 to the first dielectric region 110.

At 406, a cap region 130 is formed on at least some of the first metal region 112. In some embodiments, the cap region comprises cobalt, such as CoWP. As a result, diffusion from the first metal region 112 to neighboring regions is mitigated. In this way, the cap region 130 mitigates effects of electromigration associated with copper diffusion. In some embodiments, a top surface of the cap region 130 is flush with the top surface of the first dielectric region 110, rather than the top surface of the first metal region 112 being flush with the top surface of the first dielectric region 110. In these embodiments, the first metal region is recessed between about 100 Å to about 700 Å prior to forming the cap region. The cap region is formed by deposition or electroless process, in some embodiments. The cap region has a thickness of between about 100 Å to about 300 Å, in some embodiments.

At 408, an etch stop layer (ESL) 210 is formed on the cap region 130 and the first dielectric region 110. The ESL 210 is formed by a deposition process, such as CVD, in some embodiments, and has a thickness between about 100 Å and about 300 Å, in some embodiments.

At 410, a second dielectric region 120 is formed on the ESL. The second dielectric region 120 has a thickness greater than about 500 Å, in some embodiments. At 412, a first trench opening is formed within the second dielectric region 120. At 414, a via opening is formed within the second dielectric region 120. It will be appreciated that a trench first approach is used in some embodiments, while a via first approach is used in other embodiments, where a via opening is formed before a trench opening in a via first approach. During formation of the first trench opening and the first via opening, dry etching with $C_4F_8$ as a reactive gas is used to etch at least one of the second dielectric layer 120 and the ESL 210, in some embodiments.

It will be appreciated that the via opening is formed to extend through the ESL 210, the cap region 130, and into at least some of the first metal region 112. The first via opening is formed such that a via recess distance 202 between about 100 Å to about 400 Å is etched into the first metal region, in some embodiments. It will be appreciated that various techniques are used to pattern the cap region 130 and the first metal region 112 depending upon a desired profile, as described below.

At 416, a barrier region 150 is formed within the first via opening and the first trench opening. The barrier region 150 comprises TaN, and is formed by PVD, CVD, or ALD, according to some embodiments. The barrier region mitigates metal, such as copper from a via plug or a metal region from diffusing into a neighboring dielectric region, thereby mitigating electromigration, for example.

At 418, a via plug 124 is formed within the first via opening by metallization. At 420, a second metal region 122 is formed within the first trench opening by metallization. It will be appreciated that the via plug 124 and the second metal region 122 are formed concurrently in some embodiments. The second metal region 122 has a width between about 250 Å to about 400 Å, in some embodiments, and the via plug has a height or thickness greater than 500 Å, in some embodiments. Because the via plug 124 is formed within the first via opening, it conforms to the profile of the first via opening. A bottom portion 126 of the via plug 124 thus comprises a tapered profile, in some embodiment, when the first via opening is formed accordingly. In this way, the bottom portion 126 of the via plug 124 is recessed within the first metal region 112. In some embodiments, a via recess distance 202 is between about 100 Å to about 500 Å. Because the via plug 124 makes electrical contact with the first metal region 112 rather than the cap region 130 as an intermediary layer, RC performance for a conductive path comprising the first metal region 112, the via plug 124, and the second metal region 122 is enhanced.

Figure 5:
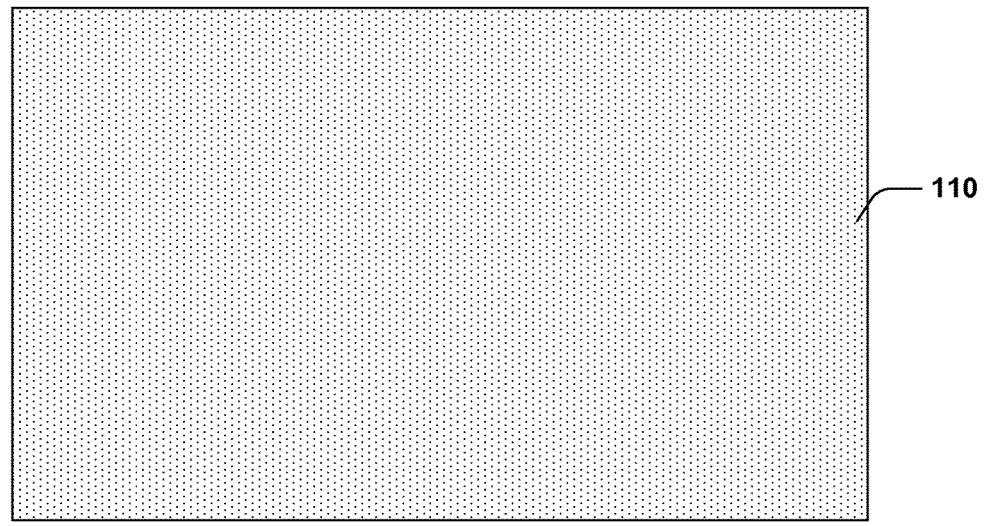
FIG. 5 is a cross-sectional view of a semiconductor structure during an intermediate fabrication stage, according to some embodiments.

FIG. 5 is a cross-sectional view 500 of a semiconductor structure during an intermediate fabrication stage, according to some embodiments. A first dielectric region 110 is formed on a substrate (not shown).

Figure 6:
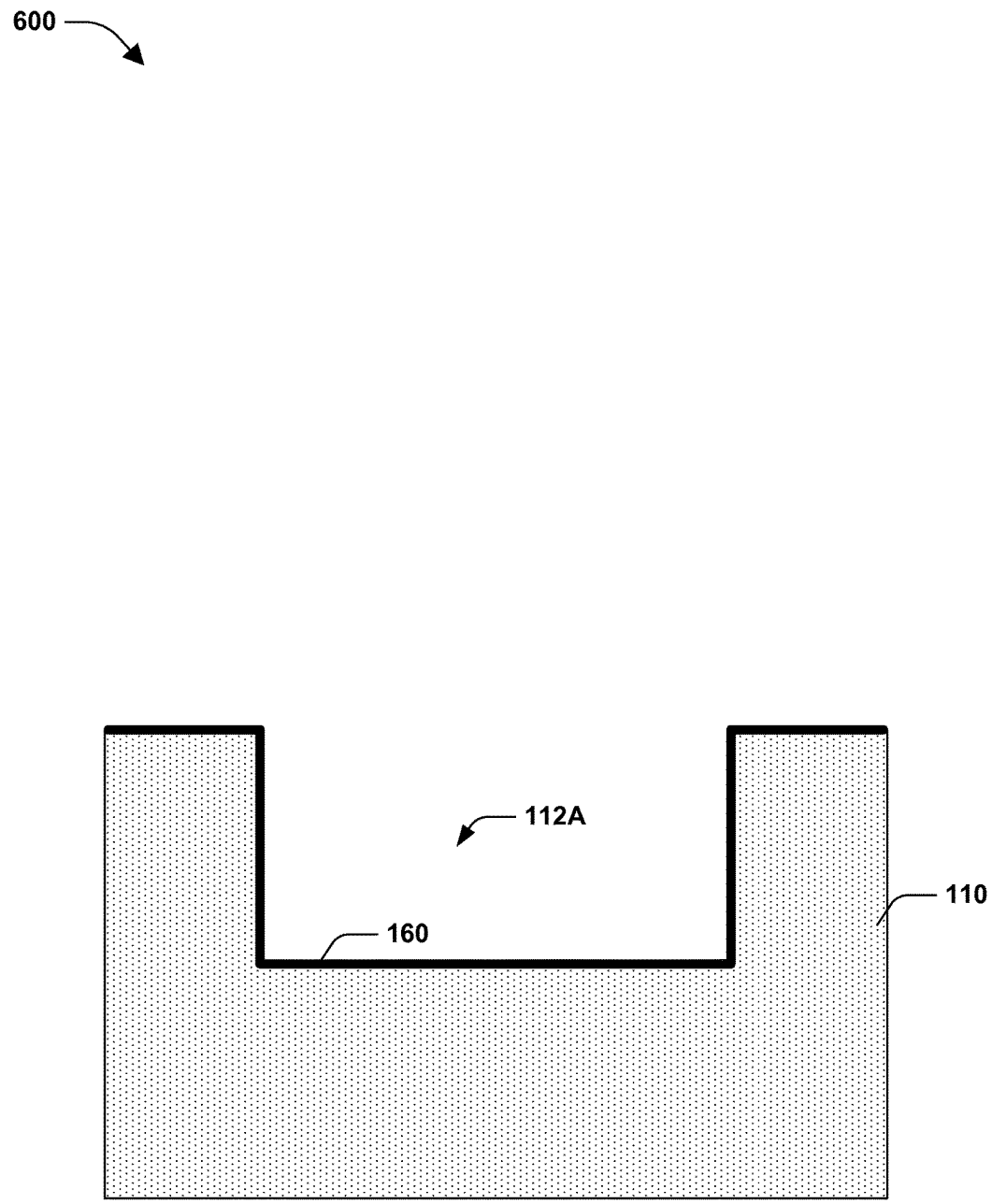
FIG. 6 is a cross-sectional view of a semiconductor structure during an intermediate fabrication stage, according to some embodiments.

FIG. 6 is a cross-sectional view 600 of a semiconductor structure during an intermediate fabrication stage, according to some embodiments. A trench 112A is formed within the first dielectric region 110. Generally, the trench is formed by photolithography, such as by patterning a layer of photo resist (not shown) or a hard mask (not shown), opening a window within the photo resist layer, and etching trench 112A. In some embodiments $C_4F_8$ is used to etch the trench 112A in the first dielectric layer 110. The photo resist and hard mask layers are removed, and thus not illustrated in FIG. 5. Additionally, a barrier region 160 is formed within the trench opening 112A. The barrier region 160 is formed of tantalum nitride (TaN) or cobalt, in some embodiments. The barrier region 160 has a thickness between about 10 Å to about 100 Å, in some embodiments. The barrier region 160 is formed using deposition techniques, such as sputtering, CVD, or ALD, in some embodiments. The barrier region 160 mitigates metal (not shown) such as copper from diffusing into neighboring dielectric regions, such as the first dielectric region 110.

Figure 7:
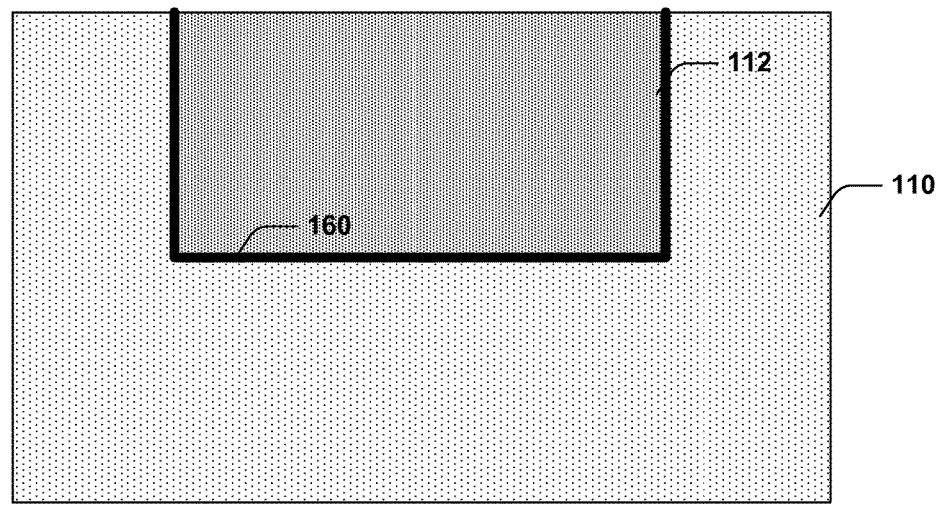
FIG. 7 is a cross-sectional view of a semiconductor structure during an intermediate fabrication stage, according to some embodiments.

FIG. 7 is a cross-sectional view 700 of a semiconductor structure during an intermediate fabrication stage, according to some embodiments. A first metal region 112 is formed within the trench 112A of FIG. 5. The first metal region 112 is formed by metallization, and is planarized to be flush with the first dielectric region 110, according to some embodiments.

Figure 8:
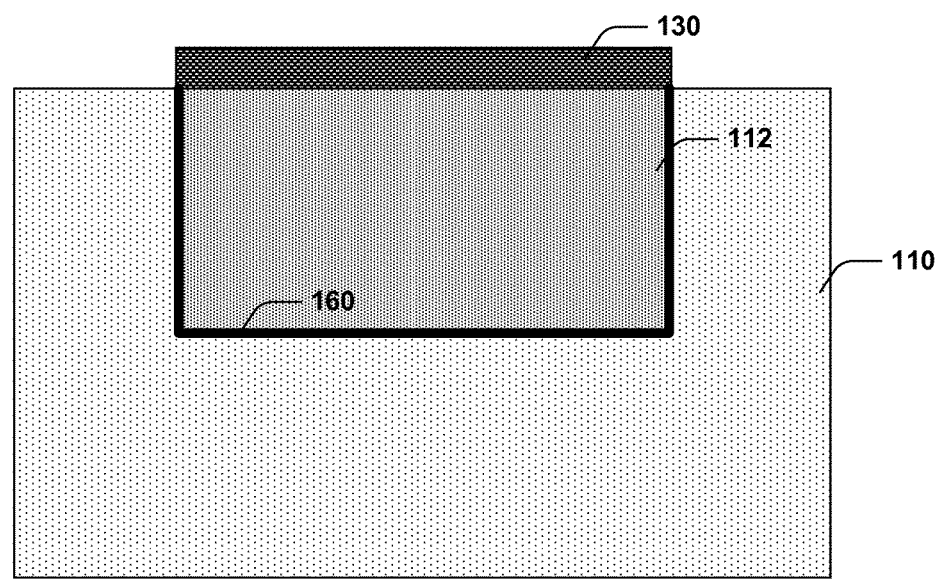
FIG. 8 is a cross-sectional view of a semiconductor structure during an intermediate fabrication stage, according to some embodiments.

FIG. 8 is a cross-sectional view 800 of a semiconductor structure during an intermediate fabrication stage, according to some embodiments. A cap region 130 is formed on at least some of the first metal region 112. In some embodiments, some of the first metal region 112 is etched back and the cap region 130 is formed within the first metal region 112. In these embodiments, the cap region 130 can be planarized such that the cap region 130 is flush with the first dielectric region 110. The cap region 130 generally comprises a material configured to mitigate diffusion of metal from the first metal region 112 to a second dielectric region (not shown).

Figure 9:
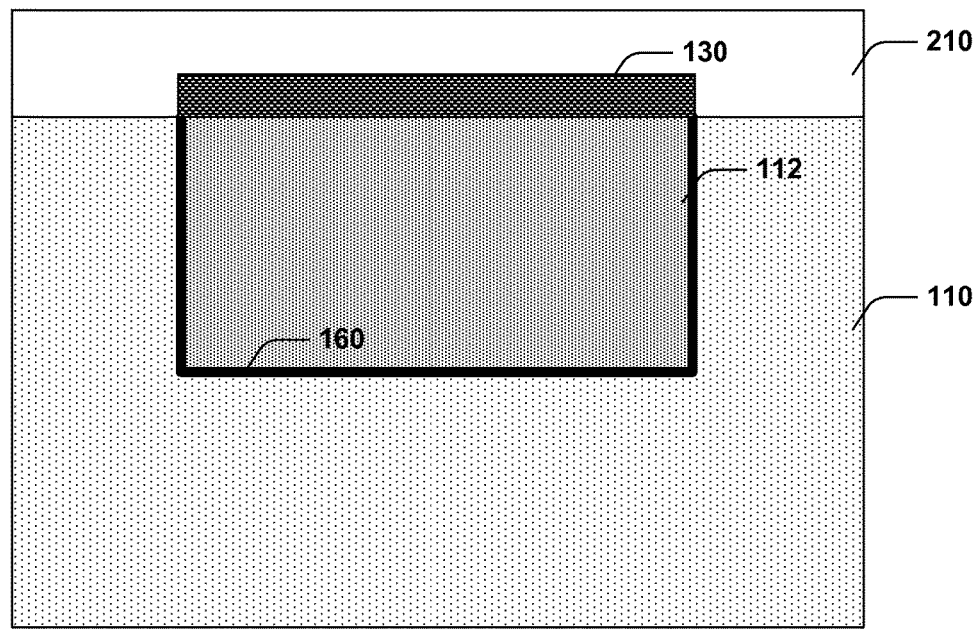
FIG. 9 is a cross-sectional view of a semiconductor structure during an intermediate fabrication stage, according to some embodiments.

FIG. 9 is a cross-sectional view 900 of a semiconductor structure during an intermediate fabrication stage, according to some embodiments. An etch stop layer (ESL) 210 is formed on at least some of the cap region 130 and the first dielectric region 110. In some embodiments, one or more additional etch stop layers are formed.

Figure 10:
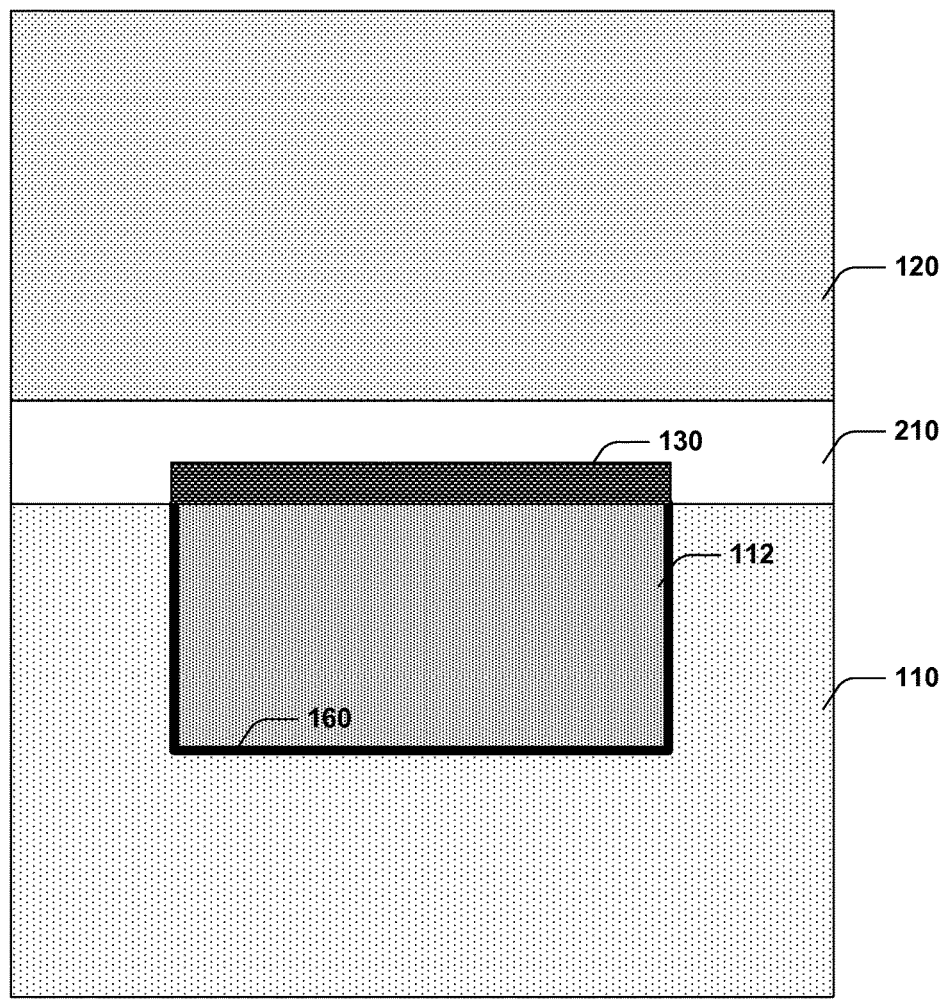
FIG. 10 is a cross-sectional view of a semiconductor structure during an intermediate fabrication stage, according to some embodiments.

FIG. 10 is a cross-sectional view 1000 of a semiconductor structure during an intermediate fabrication stage, according to some embodiments. A second dielectric region 120 is formed on the ESL 210.

Figure 11:
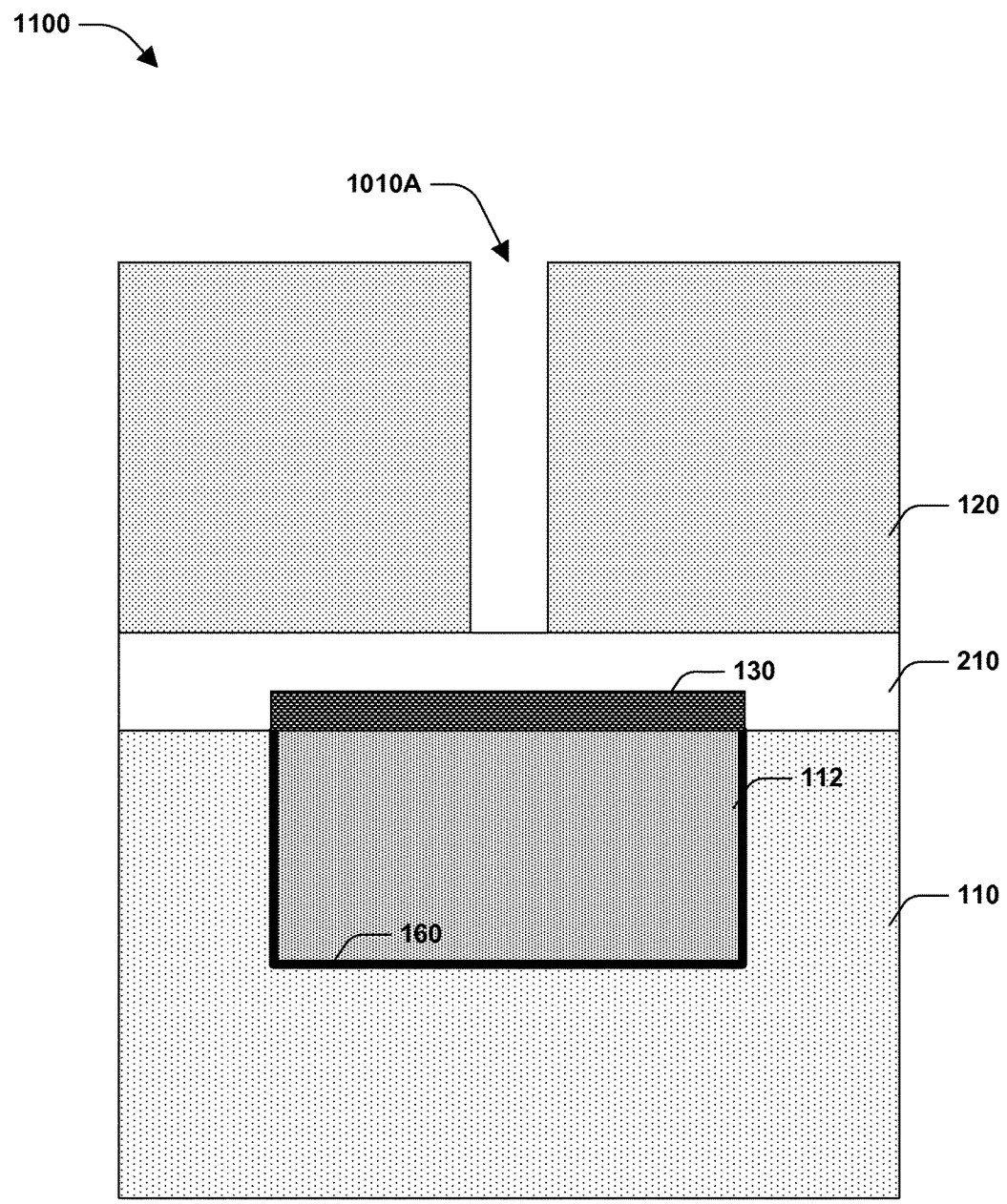
FIG. 11 is a cross-sectional view of a semiconductor structure during an intermediate fabrication stage, according to some embodiments.

FIG. 11 is a cross-sectional view 1100 of a semiconductor structure during an intermediate fabrication stage, according to some embodiments. FIG. 10 illustrates a via first approach where a first via opening 1010A is formed by etching through the second dielectric region 120 to the ESL 210. According to some embodiments, the first via opening 1010A is formed using $C_4F_8$ as a reactive etchant in a plasma etching process for between about fifteen seconds to about forty five seconds at a temperature of between about 45° C. to about 75° C. However, in some embodiments wet etching is used as well or alternatively.

Figure 12:
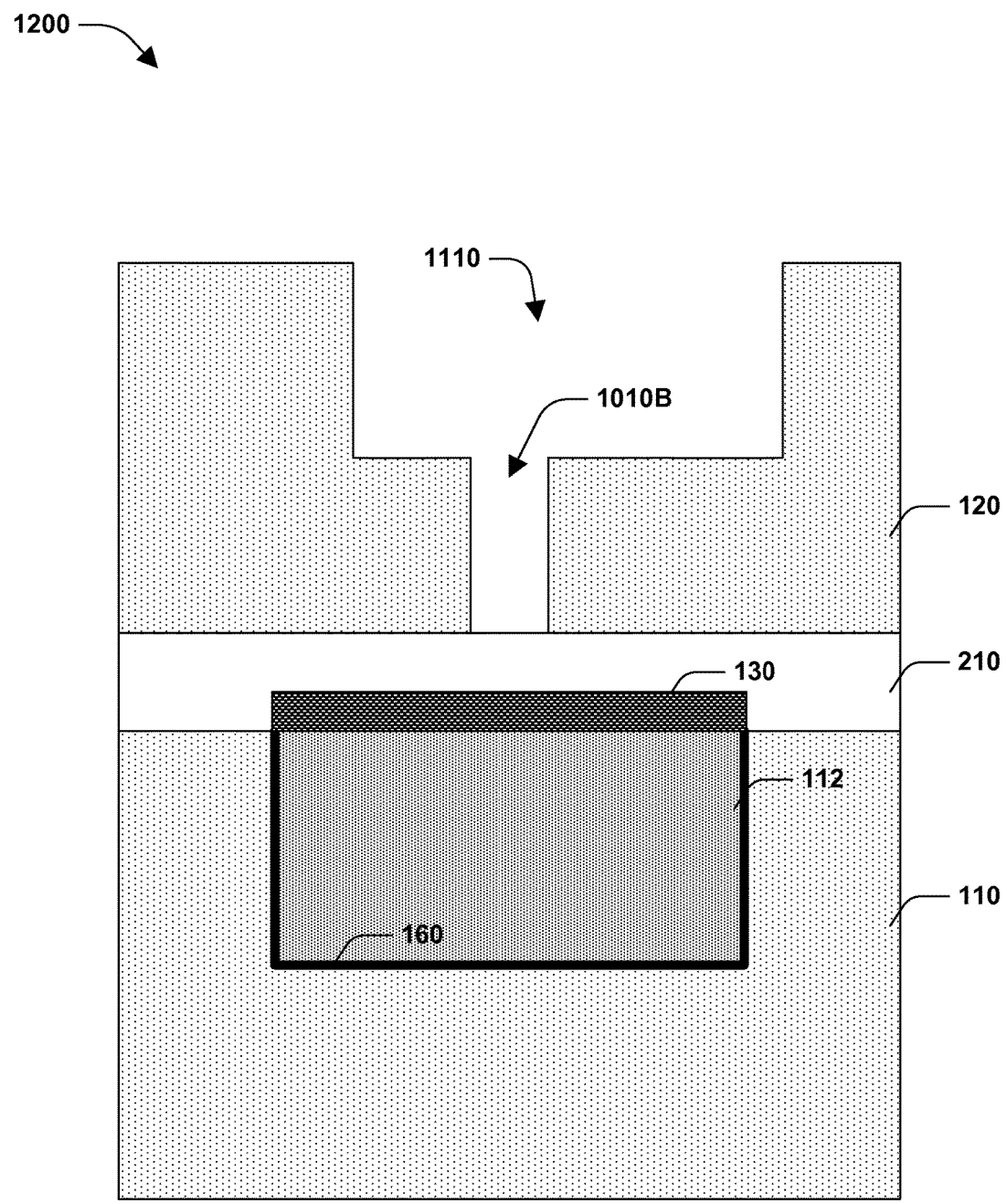
FIG. 12 is a cross-sectional view of a semiconductor structure during an intermediate fabrication stage, according to some embodiments.

FIG. 12 is a cross-sectional view 1200 of a semiconductor structure during an intermediate fabrication stage, according to some embodiments. A first trench opening 1110 is etched within the second dielectric region 120 to facilitate formation of a metal region at a later time. In some embodiments, an anisotropic etch is used to 'dig' through the second dielectric region 120 and form the first trench opening 1110. It will be appreciated that a trench first approach is used in some embodiments where the first trench opening 1110 is etched prior to etching the first via opening 1010A. According to some embodiments, the first trench opening 1010 is formed using $C_4F_8$ as a reactive etchant in a plasma etching process for between about 15 seconds to about 45 seconds at a temperature of between about 45° C. to about 75° C. However, in some embodiments wet etching is used as well or alternatively. In FIG. 11, the first via opening is labeled as 1010B because the first trench opening 1110 is formed 'over' some of the first trench opening 1010A from FIG. 10.

Figure 13:
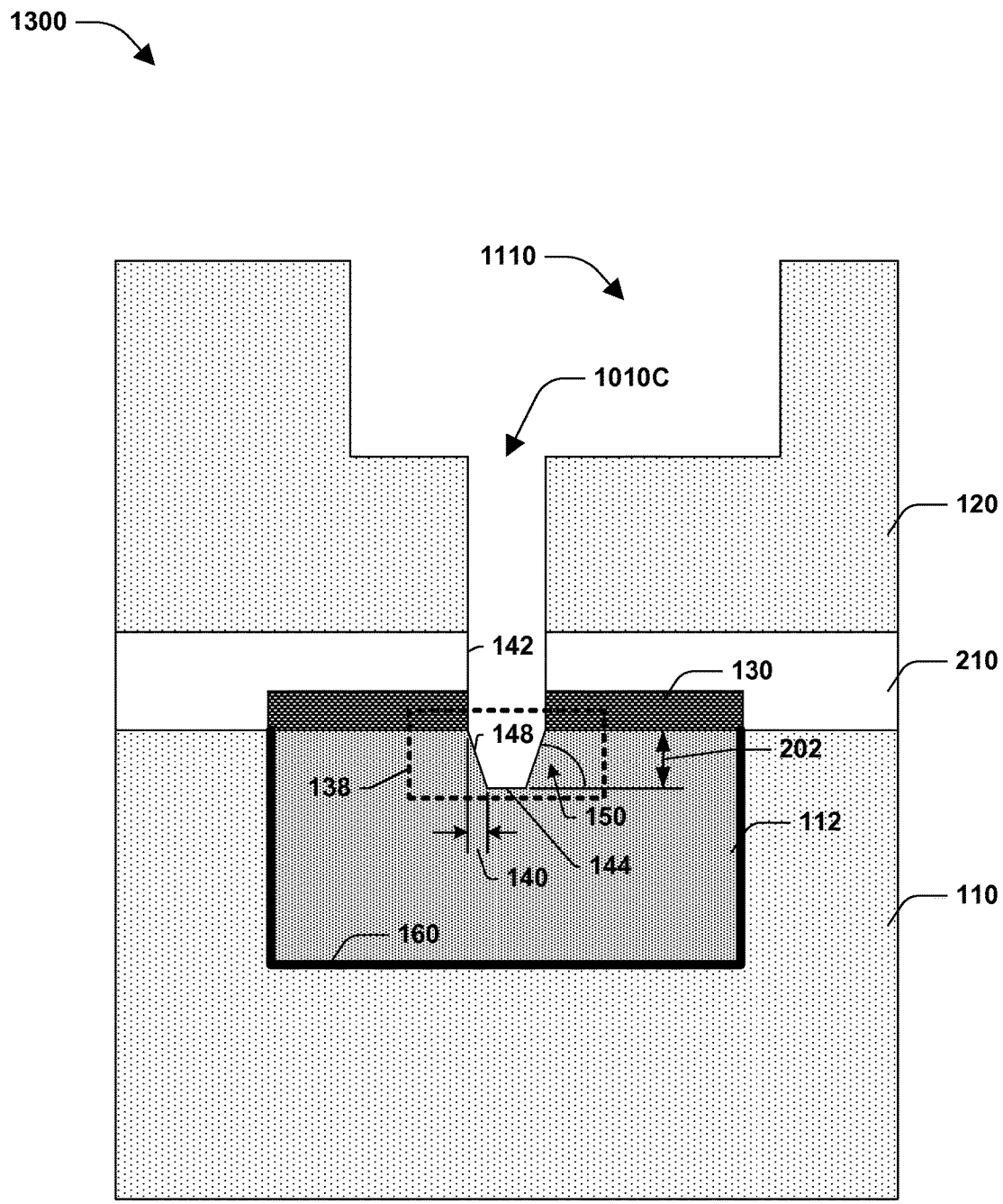
FIG. 13 is a cross-sectional view of a semiconductor structure during an intermediate fabrication stage, according to some embodiments.

FIG. 13 is a cross-sectional view 1300 of a semiconductor structure during an intermediate fabrication stage, according to some embodiments. It will be appreciated that while the structure in FIG. 13 generally corresponds to the structure in FIG. 2, the structures of FIG. 1 and FIG. 3 are formed according to some embodiments. For example, adjusting one or more of pressure, temperature, or chemistries alone or in combination with other variables allows at least one of a dry etching process, wet etching process or other patterning process to be controlled to achieve a desired profile.

With regard to the structure illustrated in FIG. 13, according to some embodiments, $C_4F_8$ is used as a reactive gas in a plasma etching process for between about fifteen seconds to about forty five seconds at a temperature of between about 45° C. to about 75° C. to remove the ESL. According to some embodiments, a three to one ratio of HCl to $H_2O_2$ is used for between about five seconds to about fifteen seconds at a temperature of between about 30° C. to about 60° C. to remove the cap region 130. According to some embodiments, a one to one ratio of $H_2O$ to $HNO_3$ is used for between about five seconds to about fifteen seconds at a temperature of between about 30° C. to about 60° C. to remove some of the first metal region 112. Additional or alternative techniques are used in some embodiments to achieve a desired profile. For example, at least one of a reactive ion etch or ion bombardment is used in some embodiments to achieve a desired profile, such as a profile having a particular degree or amount of tapering, including for the structures illustrated in FIG. 1 and in FIG. 3. According, to some embodiments, an anisotropic etch is used to form the profile in FIG. 1. According, to some embodiments, an isotropic etch is used to form the profile in FIG. 3. According to some embodiments, a plasma etch using Argon is used to form the profile illustrated in FIG. 13. Again, however, it will be appreciated that various techniques can be used to form various profiles. For example, at least one of a wet etch, a dry etch or other patterning process is used to form at least one of the profiles illustrated in FIG. 1, FIG. 2 or FIG. 3. For example, pressure or temperature or other variables are controlled to achieve at least one of a particular etch selectivity or etch rate to achieve a desired profile, according to some embodiments.

The via opening 1010C, or a tapered bottom portion 138 thereof, is formed to have a via recess distance 202 within the first metal region 112. In some embodiments, the via recess distance 202 is between about 100 Å to about 500 Å. The tapered bottom portion 138 of the via opening 1010C also has taper distance 140 as measured from a non-sloping sidewall 142 defining the via opening 1010C to a non-sloping bottom 144 of second dielectric region 112. According to some embodiments the taper distance 140 is between about 50 Å to about 150 Å. It will be appreciated that a sloping or tapered sidewall 148 of the second dielectric region 112 defining the tapered bottom portion 138 is generally comprised within the taper distance 140. According to some embodiments the tapered sidewall 148 is formed at an angle 150 of between about 30° to about 60° relative to the non-sloping bottom 144 of the second dielectric region 112.

It will be appreciated that the tapered profile offers advantages over a square or rectangular non-tapered profile. For example, the lack of sharp corners in the tapered profile allows a barrier layer or other layers to be more uniformly or conformally formed within the tapered bottom portion 138 of the via opening 1010C. For example, the thickness of a layer within a corner region of a square or rectangular space can differ from the thickness of the layer in other areas of the space. It will be appreciated that more uniformly formed layers are generally associated with more reliable and predictable behavior. Additionally, the tapered profile allows a via plug formed therein to have a corresponding tapered profile such that the via plug experience less current clouding, electromigration and stress migration, which are induced by physical phenomena occurring at sharp corners, for example.

Figure 14:
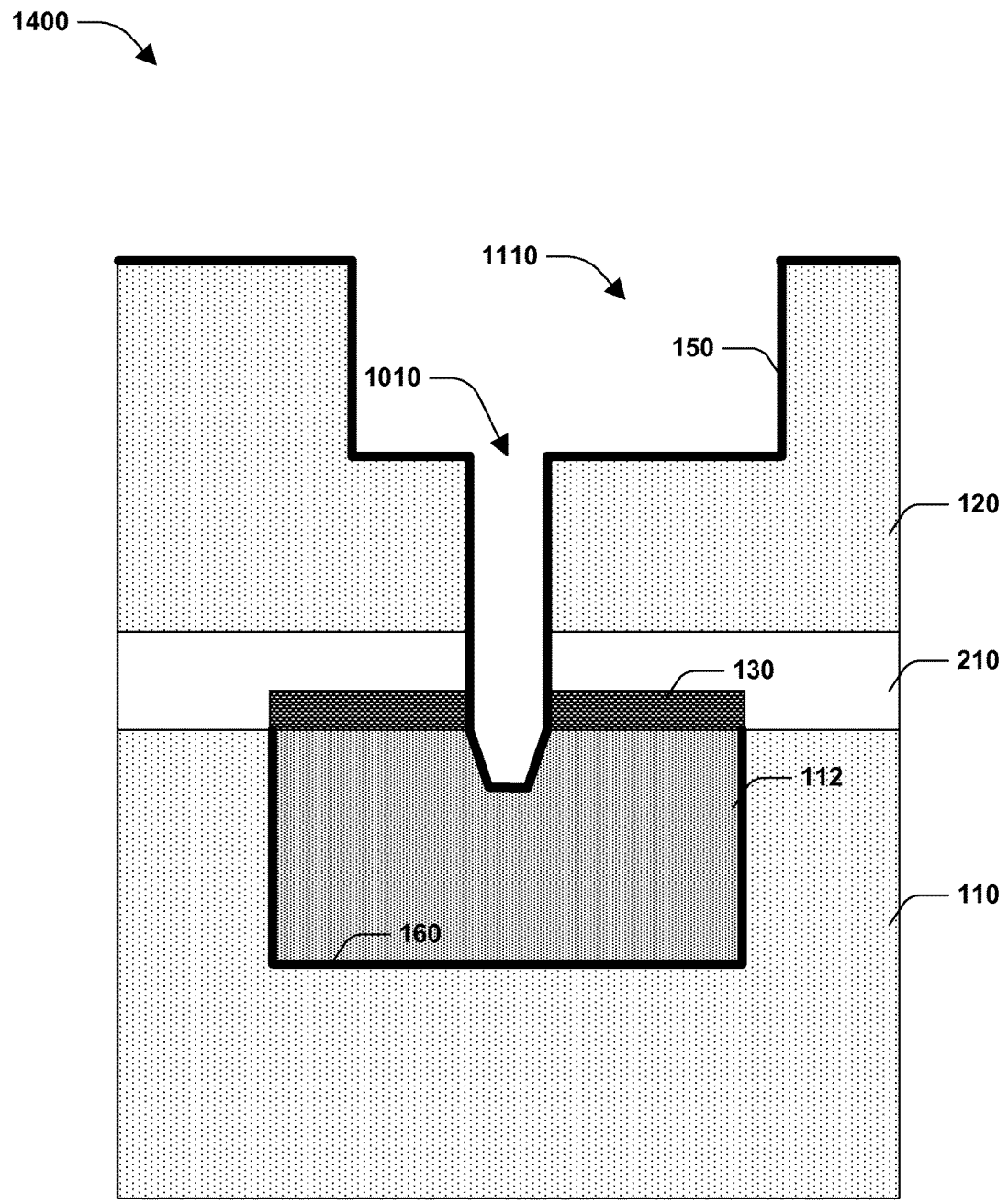
FIG. 14 is a cross-sectional view of a semiconductor structure during an intermediate fabrication stage, according to some embodiments.

FIG. 14 is a cross-sectional view 1400 of a semiconductor structure during an intermediate fabrication stage, according to some embodiments. A barrier region 150 is formed within the first via opening 1010 and the first trench opening 1110. The barrier region 150 comprises TaN, cobalt, etc. and is configured to mitigate metal from a via plug (not shown) and a second metal region (not shown) from diffusing into surrounding regions, such as the second dielectric region 120, for example. The barrier region is formed by PVD, CVD, or ALD, and is generally between about 10 Å to about 100 Å, in some embodiments.

Figure 15:
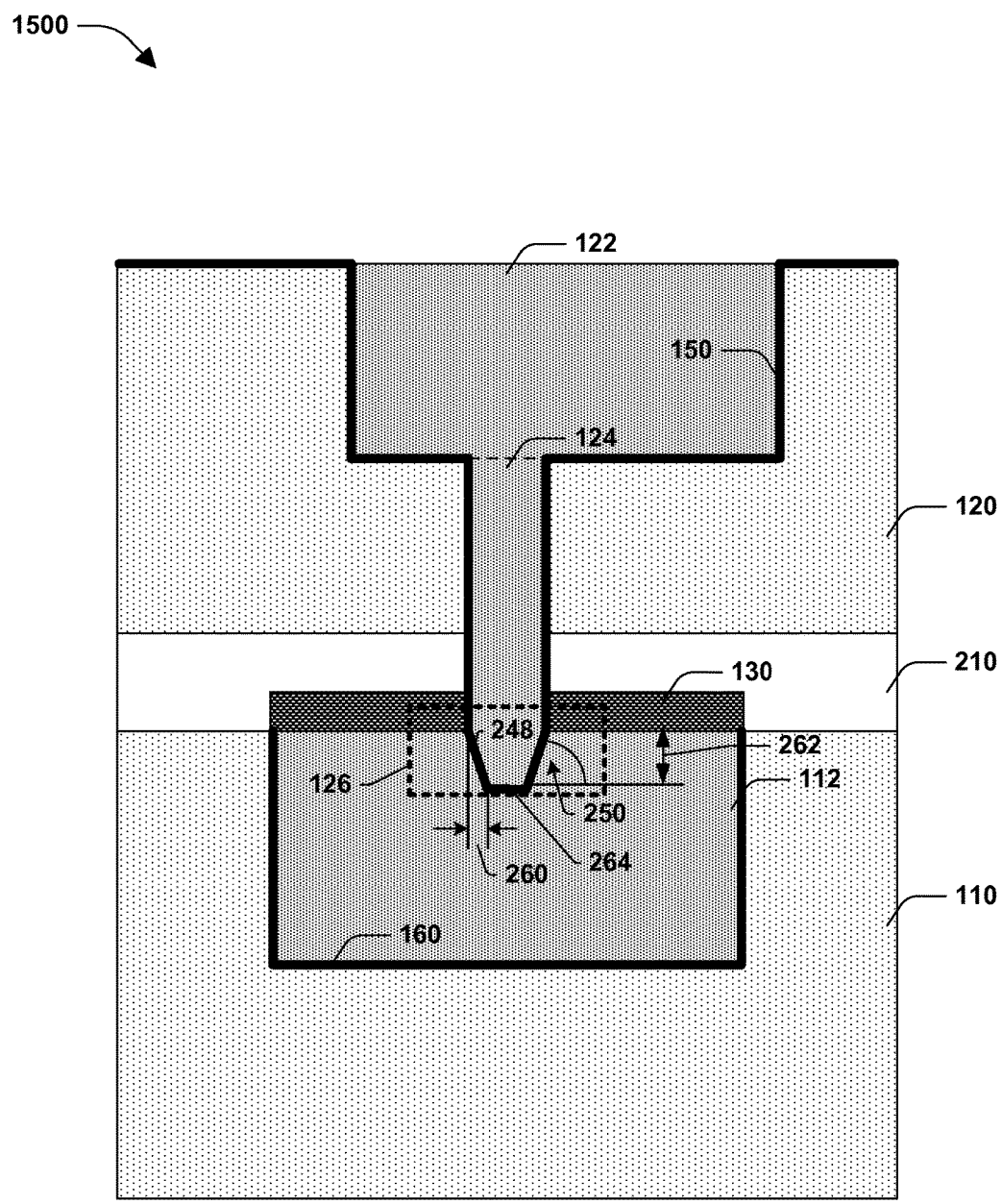
FIG. 15 is a cross-sectional view of a semiconductor structure during an intermediate fabrication stage, according to some embodiments.

FIG. 15 is a cross-sectional view 1500 of a semiconductor structure during an intermediate fabrication stage, according to some embodiments. The first trench opening 1110 and the first via opening 1010 are filled with metal, such as copper, to form a second metal region 122 and a via plug 124. Although a dashed line is drawn between the second metal region 122 and the via plug 124, the two regions are formed as a single continuous region when using a dual damascene approach.

It will be appreciated that since the bottom portion 126 of the via plug 124 is formed within the tapered bottom portion 138 of the via opening 1010C, the bottom portion 126 has the same or similar features or characteristics as the bottom portion 138. For example, the bottom portion 126 of the via plug 124 has a plug recess distance 262 within the first metal region 112 of between about 100 Å to about 500 Å. The bottom portion 126 of the via plug 124 has plug taper distance 260 of between about 50 Å to about 150 Å. The bottom portion 126 of the via plug 124 has a plug sloping or tapered sidewall 248 that is generally comprised within the plug taper distance 260. The plug tapered sidewall 248 is at an angle 250 of between about 30° to about 60° relative to a bottom surface 264 of the via plug formed on the non-sloping bottom 144 of the second dielectric region 112. It will be appreciated that bottom portion 126 has different configurations according to some embodiments, and is not to be limited to the particular examples illustrated herein.

One or more embodiments of techniques or systems for forming a semiconductor structure are provided herein. Generally, metal regions of an integrated circuit are connected by vias or via plugs. While a cap region formed on a metal region mitigates electromigration (EM) or stress migration (SM), electrical connectivity between the metal regions often suffers due to a higher contact resistance associated with the cap region. In some embodiments provided herein, a via plug is formed within a first metal region such that the via plug is recessed at least about 250 Å to 400 Å within the first metal region. This enables the via plug to have direct contact with the metal regions, rather than with the cap region. In some embodiments, the portion of the via plug that extends into the first metal region has a tapered profile, which offers advantages over non-tapered profiles. To achieve such a configuration, over-etching is used to form a via opening through the cap region. For example, ion bombardment, reactive ion etching (RIE), plasma etching, etc., is used to remove a cap region above the first metal region and some of the first metal region to create a recess for a via opening within the first metal region. In some embodiments, a wet etch is used to remove an etch stop layer (ESL), the cap region, or some of the first metal region. For example, the wet etch solution comprises $H_2O$ and $HNO_3$ or HCL and $H_2O_2$. In this way, the cap region mitigates EM and SM and electrical connectivity between metal regions is improved, due to the direct contact between the via plug and the first metal region, which is facilitated by the recess within the first metal region.

According to some aspects, a semiconductor structure is provided, comprising a first metal region, a cap region, a second metal region, a via plug, and a barrier region. The first metal region is within at least some of a first dielectric region. The cap region is above at least some of the first metal region. The second metal region is within at least some of a second dielectric region, where the second dielectric region is above at least some of at least one of the first dielectric region, the cap region, or the first metal region. The via plug extends through the cap region and is within at least some of the first metal region and the second dielectric region. Additionally, the via plug is electrically connected to the second metal region and has a tapered profile within the first metal region. The barrier region is between the second metal region and the second dielectric region and between the via plug and the second dielectric region, the cap region, and the first metal region.

According to some aspects, a semiconductor structure is provided, comprising a first dielectric region, a first metal region, a cap region, a second dielectric region, an etch stop layer (ESL), a second metal region, a via plug, and a barrier region. The first metal region is within at least some of the first dielectric region. The cap region is above at least some of the first metal region. The second dielectric region is above at least some of at least one of the first dielectric region, the cap region, or the first metal region. The ESL is between the first dielectric region and the second dielectric region. The second metal region is within at least some of the second dielectric region. The via plug extends through the ESL and the cap region and is within at least some of the first metal region and the second dielectric region. Additionally, the via plug is electrically connected to the second metal region and has a tapered profile in the first metal region. The barrier region is between the second metal region and the second dielectric region and between the via plug and the second dielectric region, the ESL, the cap region, and the first metal region.

According to some aspects, a method for forming a semiconductor structure is provided. The method comprises forming a first metal region within at least some of a first dielectric region. The method comprises forming a cap region above at least some of the first metal region. The method comprises forming an etch stop layer (ESL) above at least some of at least one of the cap region, the first metal region, or the first dielectric region. The method comprises forming a second dielectric region above at least some of at least one of the first dielectric region, the cap region, or the ESL. The method comprises forming a first trench opening by removing at least some of the second dielectric region. The method comprises forming a first via opening within the first metal region by removing at least some of the second dielectric region, the ESL, the cap region, or the first metal region. The method comprises forming a barrier region within the first trench opening and the first via opening. The method comprises forming a via plug within the first via opening. The method comprises forming a second metal region within the first trench opening.

Although the subject matter has been described in language specific to structural features or methodological acts, it is to be understood that the subject matter of the appended claims is not necessarily limited to the specific features or acts described above. Rather, the specific features and acts described above are disclosed as exemplary embodiments.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that regions, features, regions, elements, such as the first dielectric region, the second dielectric region, the first metal region, the second metal region, the etch stop layer (ESL), the cap region, the via plug, the barrier region, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the regions, features, regions, elements, etc. mentioned herein, such as implanting techniques, etching techniques, doping techniques, spin-on techniques, such as spin coating, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic region deposition (ALD).

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A semiconductor structure, comprising:
  a first metal region within at least some of a first dielectric region;
  a first barrier region between the first metal region and the first dielectric region, the first barrier region including a substantially vertical sidewall;
  a conductive cap region above the first metal region;
  a second metal region within at least some of a second dielectric region, the second dielectric region above at least some of at least one of the first dielectric region, the conductive cap region, or the first metal region;
an etch stop layer (ESL) disposed between the first dielectric region and the second dielectric region, wherein a bottom surface of the ESL, a top surface of the first barrier region, a top surface of the first dielectric region, and a top surface of the conductive cap region are coplanar;
a via plug connecting the first metal region and the second dielectric region, the via plug extending from the second metal region through the ESL, the conductive cap region, and into the first metal region; and
a second barrier region between the second metal region and the second dielectric region and between the via plug and the second dielectric region,
wherein a substantially vertical sidewall of the second barrier region physically contacts the second metal region, the second dielectric region and the via plug,
wherein the second barrier region further includes a tapered surface extending from below a bottom surface of the conductive cap region to a horizontal surface of the second barrier region within the first metal region, the horizontal surface being perpendicular to the substantially vertical sidewall of the second barrier region, and
wherein the conductive cap region is within the first barrier region, wherein the conductive cap region includes cap sidewalls physically contacting substantially vertical sidewalls of the first barrier region and the second barrier region, wherein the cap sidewalls are aligned with sidewalls of the first metal region, and wherein the second barrier region is a uniform and conformal film.

2. The semiconductor structure of claim 1, wherein the ESL has a planar top surface.

3. The semiconductor structure of claim 1, wherein the ESL comprises carbon, silicon, nitrogen, or oxygen.

4. The semiconductor structure of claim 1, wherein a bottom portion of the via plug extends into the first metal region between about 100 Å to about 500 Å.

5. The semiconductor structure of claim 1, wherein the conductive cap region comprises CoWP.

6. The semiconductor structure of claim 1, wherein a tapered sidewall of a bottom portion of the via plug extends at an angle of between about 30° to about 60° relative to the bottom surface of the via plug.

7. The semiconductor structure of claim 1, wherein a plug taper distance of the via plug is between about 50 Å to about 150 Å.

8. The semiconductor structure of claim 1, wherein an entire bottom surface of the ESL is disposed along a single plane.

9. The semiconductor structure of claim 1, wherein the tapered surface of the second barrier region extends from a level below a bottom surface of the conductive cap region to a horizontal surface within the first metal region.

10. A semiconductor structure, comprising:
a first dielectric region;
a first metal region within at least some of the first dielectric region;
a first barrier region disposed between the first metal region and the first dielectric region, the first barrier region including a substantially vertical sidewall;
a cap region above at least some of the first metal region;
a second dielectric region above at least some of at least one of the first dielectric region, the cap region, or the first metal region;
an etch stop layer (ESL) between the first dielectric region and the second dielectric region;
a second metal region within at least some of the second dielectric region;
a via plug connecting the first metal region and the second dielectric region, the via plug extending from the second metal region through the ESL and the cap region and into the first metal region; and
a second barrier region between the second metal region and the second dielectric region and between the via plug and the second dielectric region,
wherein a substantially vertical sidewall of the second barrier region physically contacts the second dielectric region, the ESL, the cap region, and the first metal region,
wherein a tapered surface of the second barrier region extends from below a bottom surface of the cap region to a horizontal bottom surface within the first metal region that is perpendicular to the substantially vertical sidewall of the second barrier region, wherein the ESL has a single planar bottom surface, and wherein the cap region extends between the substantially vertical sidewall of the first barrier region and the substantially vertical sidewall of the second barrier region, and wherein the ESL is separated from the first metal region.

11. The semiconductor structure of claim 10, wherein the first dielectric region comprises a low-k dielectric material.

12. The semiconductor structure of claim 10, wherein the cap region physically contacts the substantially vertical sidewall of the first barrier region and the substantially vertical sidewall of the second barrier region.

13. The semiconductor structure of claim 12, wherein the cap region is conductive and the second barrier region is a uniform and conformal film.

14. The semiconductor structure of claim 10, wherein a bottom portion of the via plug extends into the first metal region between about 200 Å to about 400 Å.

15. The semiconductor structure of claim 14, wherein a tapered sidewall of the bottom portion of the via plug extends at an angle of between about 40° to about 50° relative to the bottom surface of the via plug.

16. The semiconductor structure of claim 14, wherein a plug taper distance of the via plug is between about 80 Å to about 120 Å.

17. The semiconductor structure of claim 10, wherein the ESL includes carbon, silicon, nitrogen, or oxygen.

18. The semiconductor structure of claim 10, wherein the ESL has a single planar top surface.

19. A method for forming a semiconductor structure, comprising:
forming a first metal region within at least some of a first dielectric region;
forming a first barrier region between the first metal region and the first dielectric region;
forming a conductive cap region above at least some of the first metal region such that the conductive cap region, the first barrier region, and the first dielectric region have respective top surfaces being coplanar;
forming an etch stop layer (ESL) above the conductive cap region, the first metal region, and the first dielectric region such that the ESL has a single planar bottom surface that is coplanar with a top surface of the first dielectric region, a top surface of the conductive cap region, and a top surface of the first barrier region, wherein the ESL is separated from the first metal region;

forming a second dielectric region above at least some of at least one of the first dielectric region, the conductive cap region, and the ESL;

forming a first trench opening by removing at least some of the second dielectric region, wherein the first trench opening has a substantially vertical profile extending through the second dielectric region, the ESL, the conductive cap region, and a portion of the first metal region below the conductive cap region, and wherein the first trench opening has a tapered profile extending from a level below a bottom surface of the conductive cap region into the first metal region, and wherein the tapered profile terminates at a horizontal surface of the first trench opening within the first metal region;

forming a first via opening within the first metal region by removing at least some of the second dielectric region, the ESL, the conductive cap region, or the first metal region;

forming uniformly and conformally a second barrier region within the first trench opening and the first via opening such that a substantially vertical surface of the second barrier region physically contacts the second dielectric region, the ESL, the conductive cap region, and the first metal region;

forming a via plug within the first via opening; and forming a second metal region within the first trench opening.

20. The method of claim 19, wherein the second barrier region physically contacts the via plug and the second metal region.

* * * * *